United States Patent

Mandai et al.

[11] Patent Number: 5,414,402
[45] Date of Patent: May 9, 1995

[54] MULTI-LAYER SUBSTRATE

[75] Inventors: Harufumi Mandai; Noboru Kato; Atsushi Tojyo, all of Nagaokakyo, Japan

[73] Assignee: Murata Manufacturing Co., Ltd., Nagaokakyo, Japan

[21] Appl. No.: 152,382

[22] Filed: Nov. 16, 1993

[30] Foreign Application Priority Data

Nov. 19, 1992 [JP] Japan .................................. 4-309875

[51] Int. Cl.[6] ............................................. H01F 5/02
[52] U.S. Cl. ..................................... 336/200; 336/196
[58] Field of Search ....................... 336/200, 232, 196

[56] References Cited

U.S. PATENT DOCUMENTS 3,812,442 5/1974 Muckelroy ............................ 336/83
4,926,151 3/1990 Morinaga ............................ 355/296

FOREIGN PATENT DOCUMENTS 2148475 4/1973 Germany ............................ 336/200
242320 10/1987 Japan ................................. 336/200

Primary Examiner—Leo P. Picard
Assistant Examiner—L. Thomas
Attorney, Agent, or Firm—Burns, Doane, Swecker & Mathis

[57] ABSTRACT

A multi-layer substrate which should be used with an inductor. The multi-layer substrate has an internal coil which should be connected with the inductor electrically. The internal coil has such an inductance value that the total inductance of the inductor and the internal coil will be a specified value.

4 Claims, 3 Drawing Sheets

MULTI-LAYER SUBSTRATE

BACKGROUND OF THE INVENTION

1. Field of the Invention

The present invention relates to a multi-layer substrate which should be used with an inductor.

2. Description of Related Art

Generally, a multi-layered substrate made of dielectric obtains a large inductance by mounting an inductor on a surface of the substrate. The magnetic permeability of the multi-layer substrate is low, and therefore, a large inductance can not be obtained by providing a conductive pattern for forming a coil inside the substrate.

The inductor which is mounted on the multi-layer substrate is required to have various values of inductance. However, it is impossible to comply with all the requirements because of problems such as a manufacturing cost and a storage area. Thus, conventionally, an inductor which has the most suitable inductance is selected among several kinds (or dozens) of standard items which have predetermined values of inductance, and a circuit must be designed according to the inductance of the selected inductor.

Also, as for a circuit whose tolerance in the inductance value is narrow, an inductor whose deviation is narrow is needed to be obtained exceptionally.

SUMMARY OF THE INVENTION

An object of the present invention is to provide a multi-layer substrate wherein the inductance value of an inductor can be controlled.

In order to attain the object, a multi-layer substrate according to the present invention has an internal coil to be connected with an inductor electrically. In this multi-layer substrate, a specified inductance value is obtained by a total of the inductance of the inductor and the inductance of the internal coil.

BRIEF DESCRIPTION OF THE DRAWINGS

This and other objects and features of the present invention will become apparent from the following description with reference to the accompanying drawings, in which.

DETAILED DESCRIPTION OF THE PREFERRED EMBODIMENTS

The description of preferred embodiments according to the present invention is given below, referring to the accompanying drawings.

First Embodiment: FIGS. 1 through 4

In the first embodiment, a specified value of inductance is obtained by a combination of an inductor which is a standard item and a multi-layer substrate. For example, an inductor which has 1.9 $\mu$H inductance is required for a circuit design, while the inductances of standard inductors are 1.2 $\mu$H, 1.5 $\mu$H, 1.8 $\mu$H, 2.2 $\mu$H and 2.7 $\mu$H.

Figure 1:
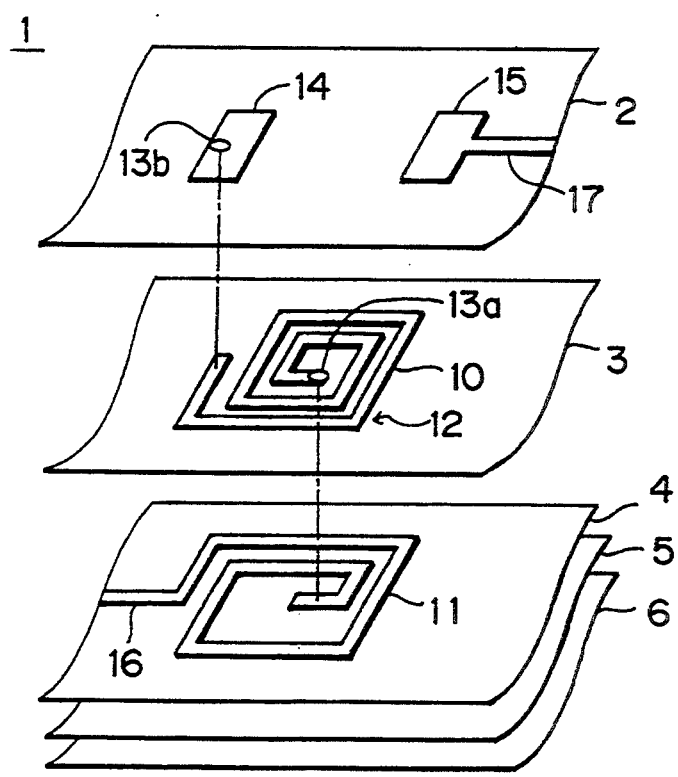
FIG. 1 is a fragmentary exploded perspective view of a multi-layer substrate which is the first embodiment of the present invention.

As shown in FIG. 1, a multi-layer substrate 1 is composed of an insulating sheet 2 which has electrodes 14 and 15 to be connected with an inductor, insulating sheets 3 and 4 which have conductors 10 and 11 for forming an internal coil 12 on their surfaces and insulating sheets 5 and 6 which have, for example, capacitor electrodes (not shown) on their surfaces. The insulating sheets 2 through 6 are made of resin or ceramic. When the insulating sheets 2 through 6 are piled up, the conductors 10 and 11 which are spiral forms are connected electrically through a via hole 13a made in the insulating sheet 3 and form the internal coil 12. The internal coil 12 is designed to have 0.1 $\mu$H inductance. The conductor 10 is connected electrically with the electrode 14 through a via hole 13b made in the insulating sheet 2. Also, the conductor 11 is connected electrically with a signal conductor 16 which is provided on the surface of the insulating sheet 4, and the electrode 15 which is to be connected with the inductor is connected electrically with a signal conductor 17 which is provided on the surface of the insulating sheet 2.

Figure 2:
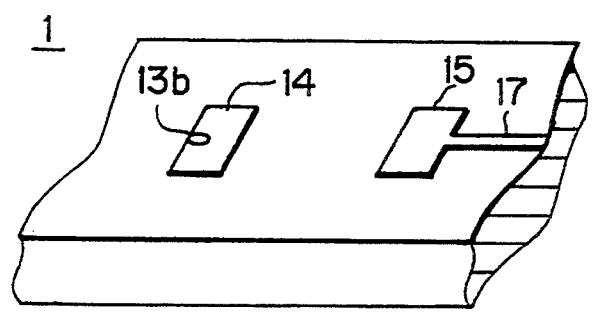
FIG. 2 is a fragmentary perspective view of the multi-layer substrate shown in FIG. 1.

As shown in FIG. 2, the insulating sheets 2 through 6 are piled up in a body and form the multi-layer substrate 1.

Figure 3:
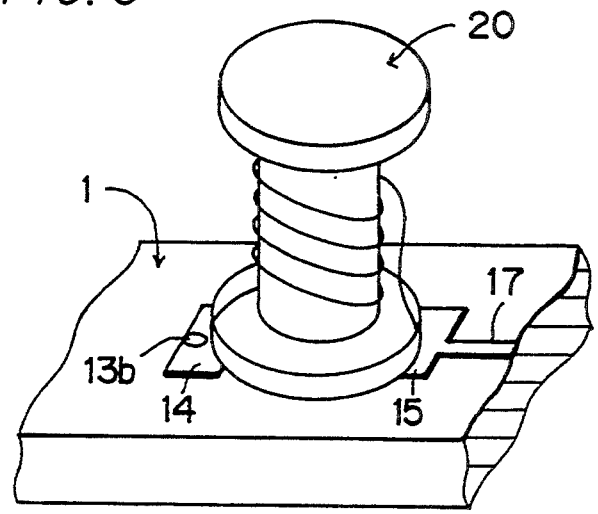
FIG. 3 is a fragmentary perspective view of the multi-layer substrate shown in FIG. 1 with an inductor mounted on the substrate.

As shown in FIG. 3, a standard inductor 20 which has 1.8 $\mu$H is mounted on the surface of the multi-layer substrate 1 obtained in the above way. Then the electrodes 14 and 15 and external electrodes (not shown) of the inductor 20 are connected electrically via solder and fixed. The inductor 20 is composed of a cylindrical body and flanges which are provided at both ends of the body.

Figure 4:
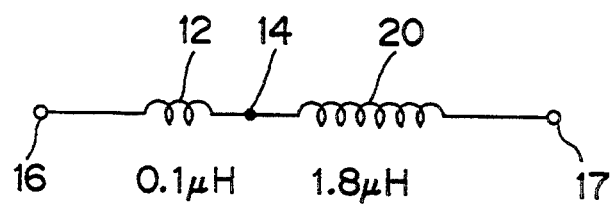
FIG. 4 is a diagram which shows an equivalent circuit of a coil section of the multi-layer substrate with the inductor shown in FIG. 3.

FIG. 4 is a diagram of an equivalent circuit of a coil section of the multi-layer substrate 1 with the inductor 20 mounted on its surface. The inductor 20 and the internal coil 12 are connected in series, and a total inductance of the inductor 20 and the internal coil 12 is 1.9 $\mu$H. Thus, necessary inductance can be obtained by the total inductance of the standard inductor 20 and the internal coil 12. Not like the conventional way, it is free from the limit wherein the circuit must be designed according to the inductance of the standard inductor. Therefore, a circuit with any inductance can be designed easily using the standard inductor. Also, since the standard inductor can be used, the manufacturing cost can be saved.

Figure 5:
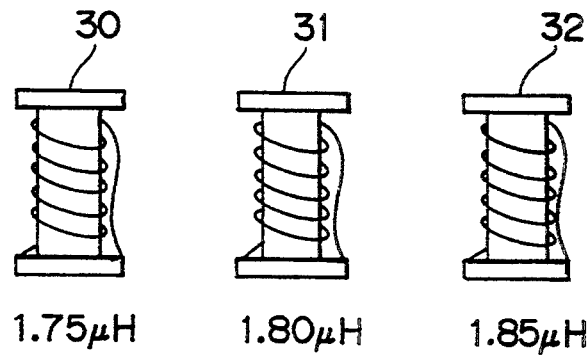
FIG. 5 is an elevational view of an inductor to be mounted on a multi-layer substrate which is a second embodiment of the present invention.
Figure 6:
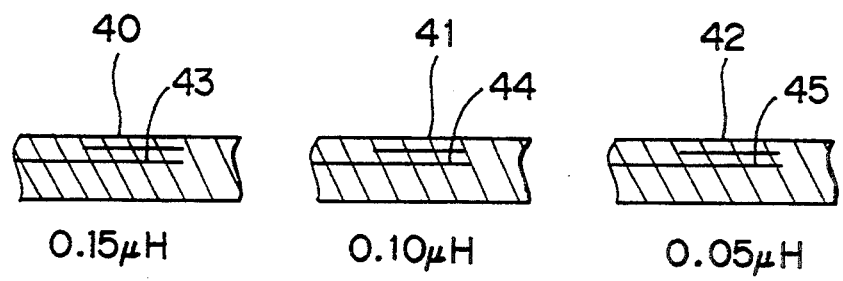
FIG. 6 is a sectional view of the multi-layer substrate which is the second embodiment of the present invention.
Figure 7:
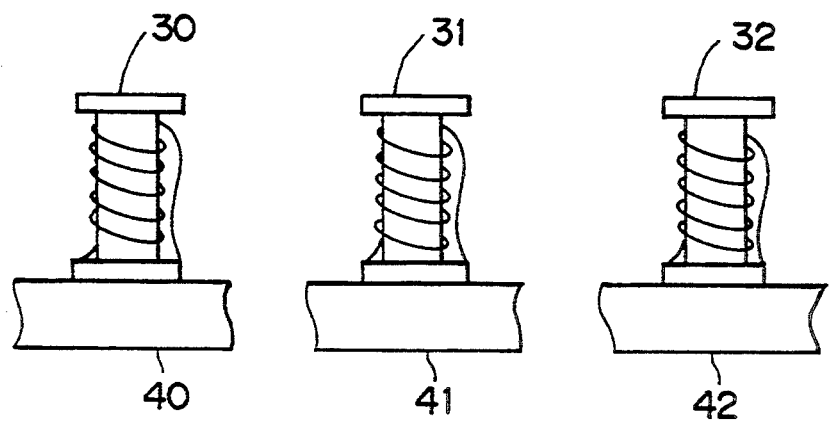
FIG. 7 is an elevational view of the multi-layer substrate shown in FIG. 6 with the inductor shown in FIG. 5 mounted on the substrate.

The Second Embodiment: FIGS. 5, 6 and 7

In the second embodiment, an inductance value with a narrow deviation is obtained by a combination of a standard inductor and a multi-layer substrate. For example, the tolerance of the standard inductor which has 1.8 μH inductance is between +0.05 and −0.05 μH, and this tolerance is not desirable for a circuit design.

As shown in FIG. 5, inductors 30, 31 and 32 have 1.75 μH, 1.80 μH and 1.85 μH inductances respectively. As shown in FIG. 6, multi-layer substrates 40, 41 and 42 whose internal coils 43, 44 and 45 have 0.15 μH, 0.10 μH, and 0.05 μH inductances respectively are manufactured beforehand. Then as shown in FIG. 7, the inductors 30, 31 and 32 are mounted on the multi-layer substrates 40, 41 and 42 respectively such that the total inductance of the inductor and the internal coil of each combination will be 1.9 μH. Also, if the inductance of the inductor is, for example, 1.82 μH, the inductor is mounted on a multi-layer substrate whose internal coil has 0.10 μH inductance. In any case, an inductor and a multi-layer substrate are combined such that the total inductance of the inductor and the internal coil will be closest to the desired value 1.9 μH.

As explained in the above, since the inductance deviation of an inductor can be revised by the inductance of the internal coil of a multi-layer substrate, the total inductance will have only narrow deviation.

Other Embodiments

Although the present invention has been described in connection with the preferred embodiments above, it is to be noted that various changes and modifications are apparent to a person skilled in the art. Such changes and modifications are to be understood as being within the scope of the present invention.

Particularly, the inductance of an internal coil does not have to be smaller than the inductance of an inductor, and the internal coil may have a larger inductance than the inductor.

What is claimed is:

1. A multi-layer substrate for use with an inductor which has a bobbin formed about an axis, the multi-layer substrate comprising:

a first insulating sheet which has an electrode for electrical connection with the inductor; and a second insulating sheet having a conductor which forms an internal coil with a axis extending along said axis of the inductor to generate a magnetic field in a same direction as a magnetic field generated by the inductor, said conductor being electrically connected with the inductor in series, the internal coil having such an inductance that a total inductance of the internal coil and the inductor is a specified value, said first and second insulating sheets being piled up in a body with the conductor and the electrode being electrically connected through a via hole in the first insulating sheet.

2. A multi-layer substrate as claimed in claim 1, wherein the inductance of the internal coil is smaller than that of the inductor.

3. A multi-layer substrate for use with an inductor which has a bobbin formed about an axis, the multi-layer substrate comprising:

an insulating sheet which has an electrode for electrical connection with the inductor; and at least two insulating sheets each having conductors which form an internal coil with an axis extending along said axis of the inductor to generate a magnetic field in a same direction as a magnetic field generated by the inductor, said conductors being electrically connected with the inductor in series, the internal coil having such an inductance that a total inductance of the internal coil and the inductor is a specified value, said insulating sheets being piled up in a body with the conductors and the electrode being electrically connected through via holes in the insulating sheets.

4. A multi-layer substrate as claimed in claim 3, wherein an inductance of the internal coil is set smaller than that of the inductor.

* * * * *